United States Patent
Heo (10) Patent No.: US 10,466,739 B1
(45) Date of Patent: Nov. 5, 2019

(54) SEMICONDUCTOR DEVICE INCLUDING DATA INPUT CIRCUIT

(71) Applicant: SK hynix Inc., Gyeonggi-do (KR)

(72) Inventor: Ji-Eun Heo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/229,333

(22) Filed: Dec. 21, 2018

(30) Foreign Application Priority Data

Aug. 20, 2018 (KR) .......................... 10-2018-0096781

(51) Int. Cl.
| | |
|---|---|
| *G06F 1/12* | (2006.01) |
| *G11C 7/22* | (2006.01) |
| *G06F 1/10* | (2006.01) |
| *H03L 7/091* | (2006.01) |

(52) U.S. Cl.
CPC .................. *G06F 1/12* (2013.01); *G06F 1/10* (2013.01); *G11C 7/222* (2013.01); *G11C 7/225* (2013.01); *H03L 7/091* (2013.01)

(58) Field of Classification Search
CPC .. G06F 1/12; G06F 1/10; G11C 7/225; G11C 7/222; H03L 7/091
USPC ........................................ 327/156, 158, 161
See application file for complete search history.

(56) References Cited

U.S. PATENT DOCUMENTS

| | | | | |
|---|---|---|---|---|
| 4,783,633 A | * | 11/1988 | Woods ...................... | H03K 5/26 326/93 |
| 2005/0046490 A1 | * | 3/2005 | Jasa ........................ | H03L 7/087 331/25 |
| 2010/0322367 A1 | * | 12/2010 | Wenske ................ | H03L 7/0807 375/373 |

FOREIGN PATENT DOCUMENTS

KP     1020060075008     7/2006

* cited by examiner

*Primary Examiner* — John W Poos
(74) *Attorney, Agent, or Firm* — IP & T Group LLP (57) ABSTRACT

A semiconductor device includes a clock selection block selecting a first or a second input clock as a reference clock based on a phase detection signal; a clock generation circuit outputting first to $N^{th}$ sampling clocks by distributing the reference clock to first to $N^{th}$ clock paths, and outputting a first training signal by delaying a test pulse through one clock path during a training operation; a data input circuit sampling input data based on the first and second input clocks and one sampling clock outputted through the same clock path as the first training signal among the first to $N^{th}$ sampling clocks; and a training circuit delaying the test pulse by a reference delay value to output a second training signal, and comparing a phase of the first training signal with a phase of the second training signal to generate the phase detection signal, during the training operation.

20 Claims, 10 Drawing Sheets

FIG. 10

SEMICONDUCTOR DEVICE INCLUDING DATA INPUT CIRCUIT

CROSS-REFERENCE TO RELATED APPLICATIONS

This application claims priority under 35 U.S.C. § 119 to Korean Patent Application No. 10-2018-0096781, filed on Aug. 20, 2018, in the Korean Intellectual Property Office, the disclosure of which is incorporated herein by reference in its entirety.

BACKGROUND

1. Field

Various exemplary embodiments of the present invention generally relate to a semiconductor design technique. Particularly, the embodiments relate to a semiconductor device including a data input circuit that receives data in synchronization with a clock.

2. Description of the Related Art

Recently, system-on-chip (SoC) design using a high integration degree is becoming increasingly common due to the development of semiconductor process technology. In addition, the rapid development of the information technology (IT) industry and the popularization of broadband networks are demanding the development of SOC that stably operates at high speed, in order to process a vast amount of information at high speed.

In the design of semiconductor devices, the synchronization with a clock is the most important factor for securing high performance and operation reliability. The structure of a clock network includes a trunk, a mesh, a symmetric H-tree, a buffer clock tree or combinations thereof. Among these clock network structures, the buffer clock tree has a disadvantage in that the chip size increases because of a buffer additionally inserted. However, since the inserted buffer amplifies a clock and separates excessive loading, high-performance clock characteristics may be obtained. Therefore, the buffer clock tree is best suited for SoC design environments.

SUMMARY

Various embodiments of the present invention are directed to a semiconductor device including a data input circuit capable of selecting a clock that samples data according to a clock tree delay amount.

In accordance with an embodiment of the present invention, a semiconductor device includes: a clock selection block suitable for selecting a first input clock or a second input clock as a reference clock based on a phase detection signal; a clock generation circuit suitable for outputting first to $N^{th}$ sampling clocks by distributing the reference clock to first to $N^{th}$ clock paths, and outputting a first training signal by delaying a test pulse through one clock path among the first to $N^{th}$ clock paths during a training operation; a data input circuit suitable for sampling input data based on the first and second input clocks and one sampling clock outputted through the same clock path as the first training signal among the first to $N^{th}$ sampling clocks; and a training circuit suitable for delaying the test pulse by a reference delay value to output a second training signal, and comparing a phase of the first training signal with a phase of the second training signal to generate the phase detection signal, during the training operation.

In accordance with an embodiment of the present invention, a semiconductor system includes: a semiconductor device; and a controller suitable for providing first and second input clocks to the semiconductor device, and transmitting and receiving data, wherein the semiconductor device comprises: a clock selection block suitable for selecting the first input clock or the second input clock as a reference clock based on a phase detection signal; a clock generation circuit suitable for outputting first to $N^{th}$ sampling clocks by distributing the reference clock to first to $N^{th}$ clock paths, and outputting a first training signal by delaying a test pulse through one clock path among the first to $N^{th}$ clock paths during a training operation; a data input circuit suitable for sampling the data transmitted from the controller based on the first and second input clocks and one sampling clock outputted through the same clock path as the first training signal among the first to $N^{th}$ sampling clocks; and a training circuit suitable for delaying the test pulse by a reference delay value to output a second training operation, and comparing a phase of the first training signal with a phase of the second training signal to generate the phase detection signal, during the training operation.

In accordance with an embodiment of the present invention, an operating method of a semiconductor device includes: generating a first training signal by applying a test pulse to one clock path among a plurality of clock paths forming a clock tree structure, and generating a second training signal by delaying the test pulse by a reference delay value, during a training operation; comparing a phase of the first training signal with a phase of the second training signal to generate a phase detection signal; selecting a first input clock or a second input clock as a reference clock based on the phase detection signal, during a normal operation; and aligning input data based on a first sampling clock generated by applying the reference clock to the one clock path.

DETAILED DESCRIPTION

Various exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

Figure 1:
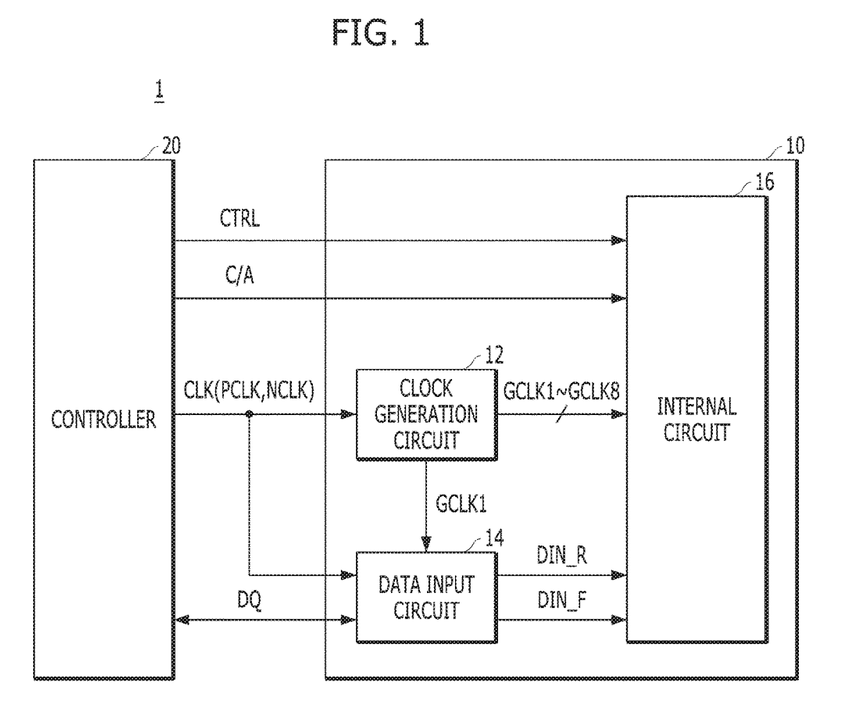
FIG. 1 is a block diagram illustrating a semiconductor system.

FIG. 1 is a block diagram illustrating a semiconductor system 1.

Referring to FIG. 1, the semiconductor system 1 may include a semiconductor device 10 and a controller 20. The controller 20 transmits and receives data DQ to and from the semiconductor device 10, and provides a command/address signal C/A, a control signal CTRL and a clock CLK to control the semiconductor device 10. The control signal CTRL may include a chip selection signal CS, a clock enable signal CKE, a global reset signal RSTB, and so on.

When the semiconductor device 10 is a memory device, the semiconductor device 10 may include a Synchronous Dynamic Random Access Memory (SDRAM) which operates in synchronization with a system clock. When the SDRAM is a double-data-rate (DDR) SDRAM which transfers data in synchronization with rising and falling edges of a system clock, pseudo differential signaling may be generally used for transmitting and receiving various signals. For example, the clock CLK may be transmitted in the form of a differential clock including a primary clock PCLK (hereinafter, referred to as a "first input clock PCLK") and a secondary clock NCLK (hereinafter referred to as a "second input clock NCLK"). That is, the second input clock NCLK has a phase opposite to a phase of the first input clock PCLK.

The semiconductor device 10 may include a clock generation circuit 12, a data input circuit 14 and an internal circuit 16. For reference, the semiconductor device 10 may further include a buffer/decoder (not illustrated) for buffering/decoding the command/address signal C/A and the control signal CTRL, and a data output circuit (not illustrated) for providing the data DQ to the controller 20. However, descriptions thereof will be omitted herein in order to fully describe the conceptual point of the present disclosure.

Figure 2:
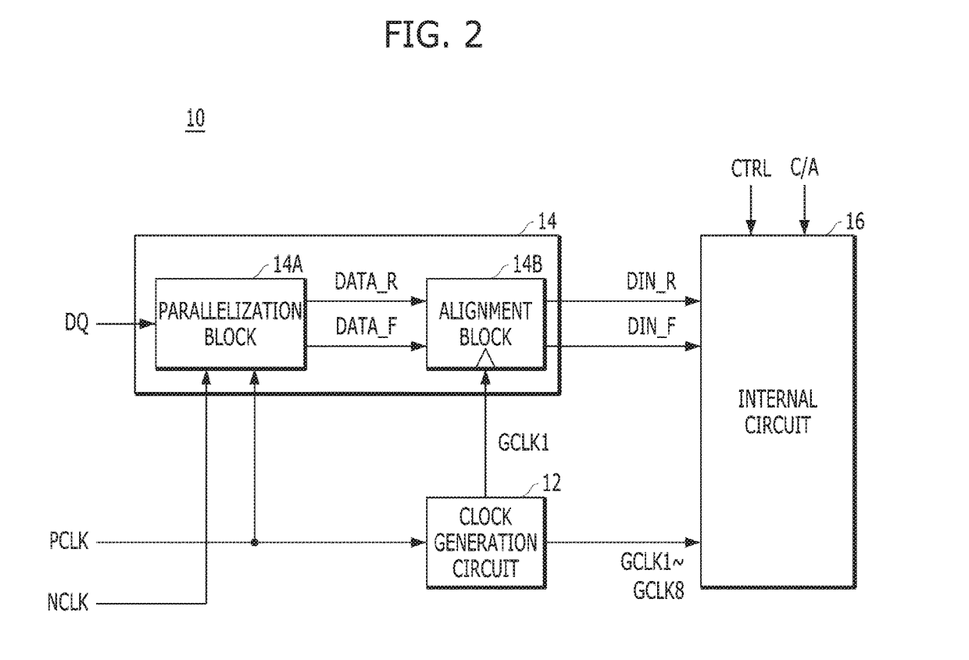
FIG. 2 is a detailed diagram of a semiconductor device shown in FIG. 1.

FIG. 2 is a block diagram illustrating the semiconductor device 10 shown in FIG. 1.

Referring to FIG. 2, the clock generation circuit 12 may receive any one of the first input clock PCLK and the second input clock NCLK and generate a plurality of sampling clocks. For example, the clock generation circuit 12 may receive the first input clock PCLK and generate first to eighth sampling clocks GCLK1 to GCLK8. The clock generation circuit 12 may have a clock tree structure composed of clock buffers, for example, a plurality of inverters. The clock generation circuit 12 may distribute the first input clock PCLK to different clock paths to output the first to eighth sampling clocks GCLK1 to GCLK8.

In this case, the clock paths of the clock tree structure may have different delay values. In other words, the first to eighth sampling clocks GCLK1 to GCLK8 may have different clock tree delay values depending on paths through which the clocks are outputted among the clock paths, and the discrepancy between delay values of the respective sampling clocks GCLK1 to GCLK8 may be defined as clock skews. When the clock skew is out of the allowable range of design, a concern referred to as 'racing a clock' occurs. Therefore, the configurations of the internal circuit 16 is required to be designed in consideration of such concern.

The data input circuit 14 may parallelize the data DQ based on the first input clock PCLK and the second input clock NCLK, and sample the parallelized data based on one of the first to eighth sampling clocks GCLK1 to GCLK8, for example, the first sampling clock GCLK1, to output first and second internal data DIN_R and DIN_F.

More specifically, the data input circuit 14 may include a parallelization block 14A, and an alignment block 14B.

The parallelization block 14A may parallelize the data DQ based on the first input clock PCLK to output first and second parallel data DATA_R and DATA_F. The alignment block 14B may align the first and second parallel data DATA_R and DATA_F based on the first sampling clock GCLK1 to output the first and second internal data DIN_R and DIN_F.

The internal circuit 16 may process the first and second internal data DIN_R and DIN_F based on the command/address signal C/A, the control signal CTRL and the first to eighth sampling clocks GCLK1 to GCLK8.

Figure 3:
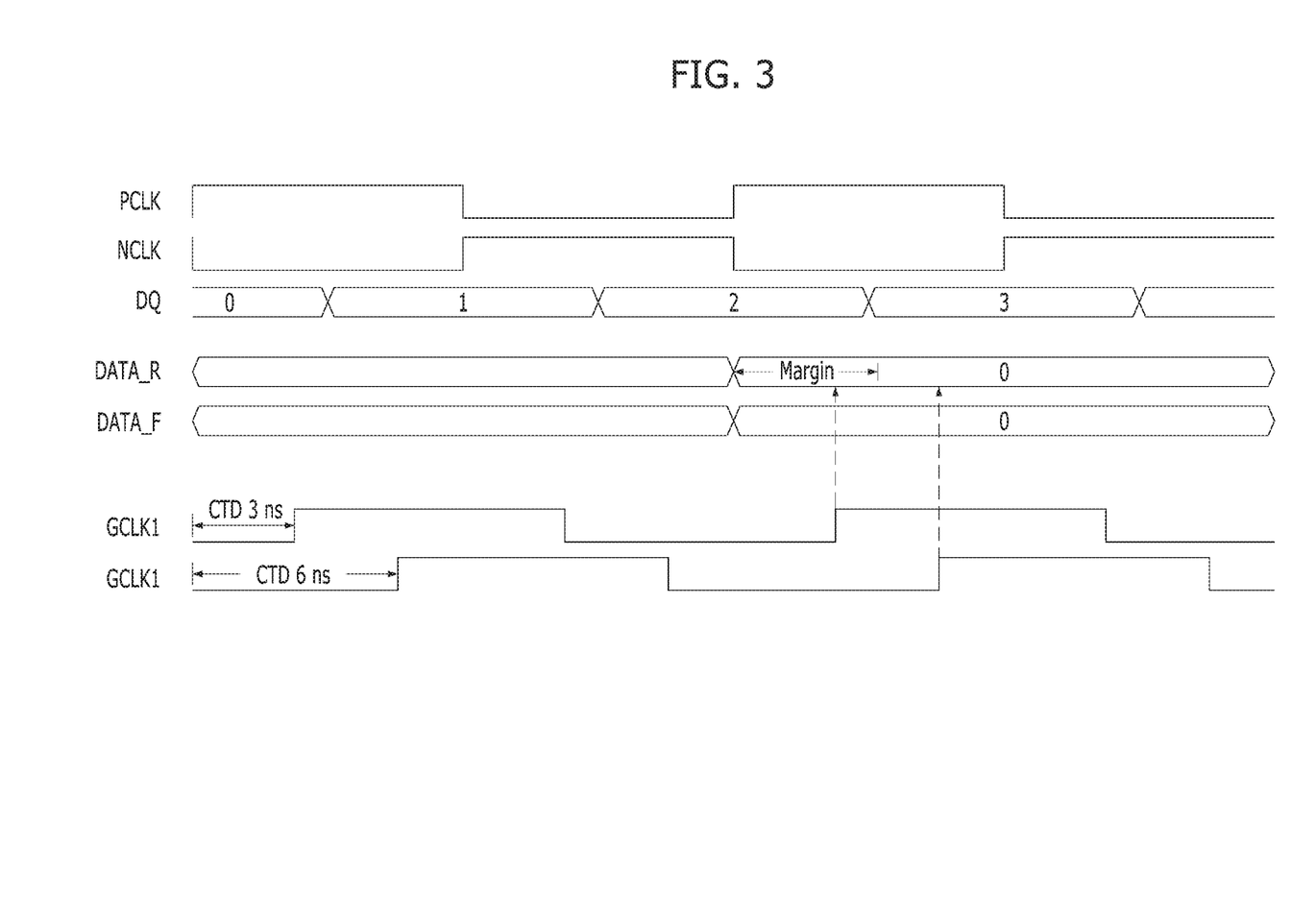
FIG. 3 is a timing diagram for describing an operation of the semiconductor device shown in FIG. 2.

FIG. 3 is a timing diagram for describing an operation of the semiconductor device 10 shown in FIG. 2.

Referring to FIG. 3, the parallelization block 14A may latch the data DQ at a rising edge of the first input clock PCLK, and latch the data DQ at a rising edge of the second input clock NCLK. The parallelization block 14A may output the latched data as the first and second parallel data DATA_R and DATA_F, respectively, at a next rising edge of the first input clock PCLK.

The alignment block 14B may latch the first and second parallel data DATA_R and DATA_F based on the first sampling clock GCLK1 to output the latched data as the first and second internal data DIN_R and DIN_F. The alignment block 14B has to secure a preset setup/hold time in order to latch the first and second parallel data DATA_R and DATA_F. In other words, only when the setup/hold time has to be secured with a proper margin, the data to be latched may be accurately centered on the clock so that the operation of the alignment block 14B may be normally performed.

In the clock tree structure of the clock generation circuit 12, in case where the clock tree delay value CTD of the clock path through which the first sampling clock GCLK1 is outputted is 6 ns, the alignment block 14B may perform a normal operation since the setup/hold time is secured with a proper margin, for example, 4 ns. However, in case where the clock tree delay value CTD of the clock path through which the first sampling clock GCLK1 is outputted is 3 ns, the arrangement block 14B may not perform an normal operation since the setup/hold time is not secured with the proper margin, i.e., 4 ns.

As described above, when the data input circuit 14 samples the data in response to the clock, the margin of the setup/hold time may be insufficient depending on the clock tree delay value.

Figure 4:
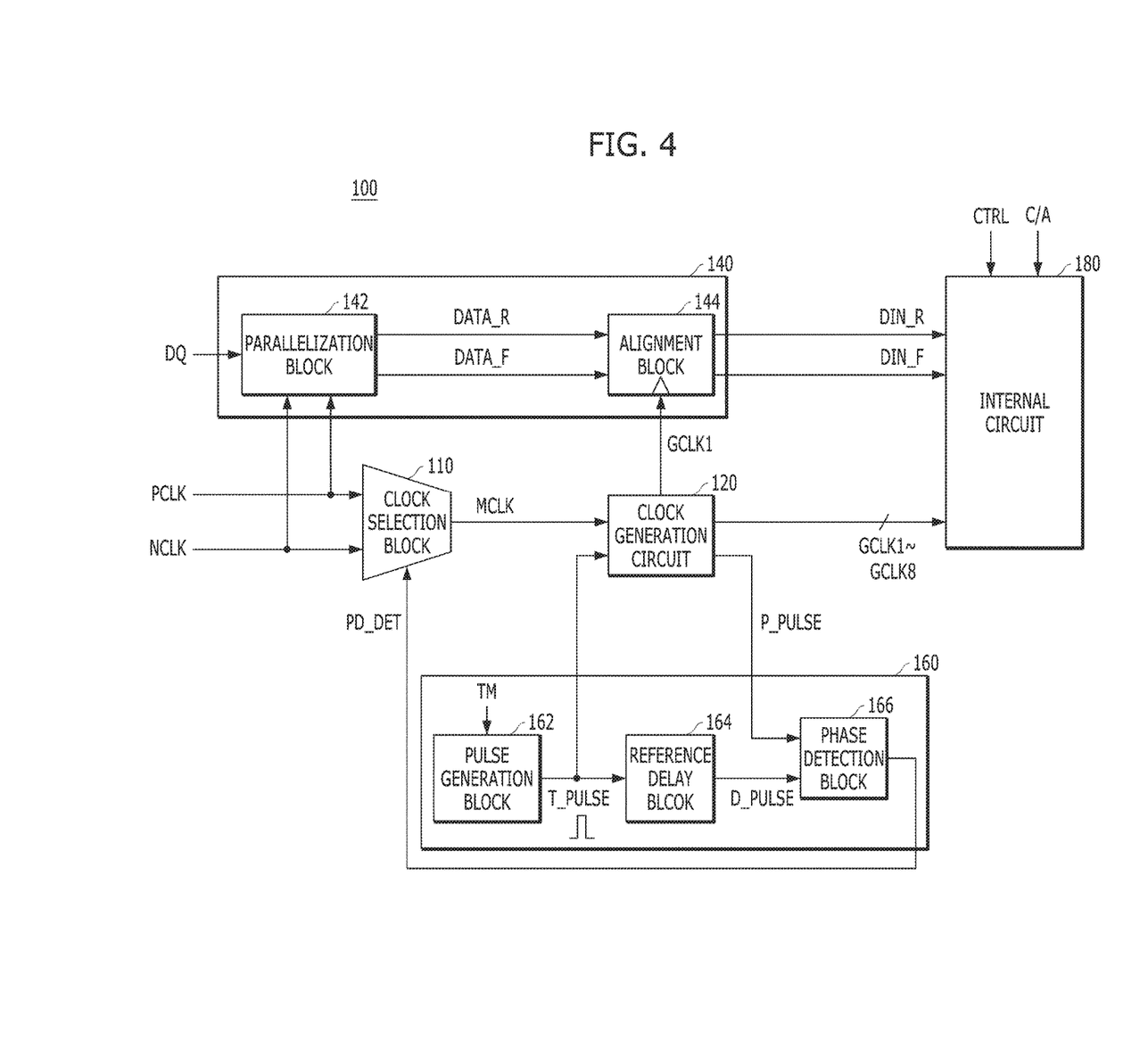
FIG. 4 is a block diagram illustrating a semiconductor device in accordance with an embodiment of the present invention.
Figure 5:
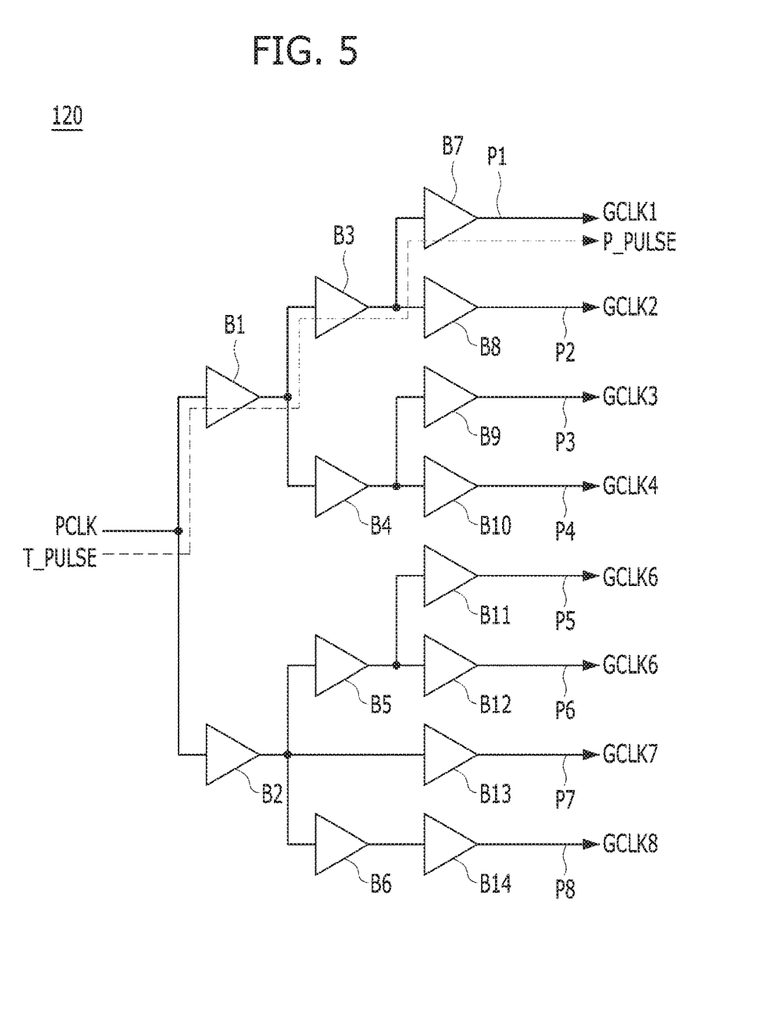
FIG. 5 is a circuit diagram of a clock generation circuit shown in FIG. 4.

FIG. 4 is a block diagram illustrating a semiconductor device 100 in accordance with an embodiment of the present invention. FIG. 5 is a circuit diagram of a clock generation circuit 120 shown in FIG. 4.

Referring to FIG. 4, the semiconductor device 100 may include a clock selection block 110, the clock generation circuit 120, a data input circuit 140, a training circuit 160 and an internal circuit 180.

The clock selection block 110 may select one of a first input clock PCLK and a second input clock NCLK based on a phase detection signal PD_DET to output a reference clock MCLK. The clock selection block 110 may be implemented with a multiplexer. The clock selection block 110 may select the second input clock NCLK as the reference clock MCLK when the phase detection signal PD_DET is of a logic high level, and select the first input clock PCLK as the reference clock MCLK when the phase detection signal PD_DET is of a logic low level.

The clock generation circuit 120 may distribute the reference clock MCLK to a plurality of clock paths to output first to eighth sampling clocks GCLK1 to GCLK8. The clock generation circuit 120 may output a first training signal P_PULSE by delaying a test pulse T_PULSE during a training operation, through one clock path among the plurality of clock paths.

Referring to FIG. 5, the clock generation circuit 120 may be implemented with a clock tree structure that forms first to eighth clock paths P1 to P8 using a plurality of clock buffers B1 to B14. For example, the clock generation circuit 120 may include the first clock path P1 composed of the clock buffers B, B3 and B7, the second clock path P2 composed of the clock buffers B, B3 and B8, the third clock path P3 composed of the clock buffers B1, B4 and B9, the fourth clock path P4 composed of the clock buffers B1, B4 and B10, the fifth clock path P5 composed of the clock buffers B2, B5 and 811, the sixth clock path P6 composed of the clock buffers B2, B5 and B12, the seventh clock path P7 composed of the clock buffers B2 and B13, and the eighth clock path P8 composed of the clock buffers B2, B6 and B14.

The clock generation circuit 120 may variably delay the reference clock MCLK through the first to eighth clock paths P1 to P8 to output the first to eighth sampling clocks GCLK1 to GCLK8. For example, the first sampling clock GCLK1 may be outputted through the first clock path P1. In addition, the clock generation circuit 120 may output the first training signal P_PULSE by applying the test pulse T_PULSE during the training operation, to the first clock path P1 through which the first sampling clock GCLK is outputted. In other words, the first sampling clock GCLK1 and the first training signal P_PULSE may be outputted through the same clock path P1, thereby having substantially the same delay value.

Referring back to FIG. 4, the data input circuit 140 may parallelize data DQ into first and second parallel data DATA_R and DATA_F based on the first input clock PCLK and the second input clock NCLK, and output first and second internal data DIN_R and DIN_F by sampling the first and second parallel data DATA_R and DATA_F based on the first sampling clock GCLK1.

More specifically, the data input circuit 140 may include a parallelization block 142 and an alignment block 144.

The parallelization block 142 may parallelize the data DQ based on the first input clock PCLK to output the first and second parallel data DATA_R and DATA_F. The alignment block 144 may align the first and second parallel data DATA_R and DATA_F based on the first sampling clock GCLK1 to output the first and second internal data DIN_R and DIN_F.

During the training operation, the training circuit 160 may delay the test pulse T_PULSE pulsing for a set period by a reference delay value to output a second training signal D_PULSE. Then, the training circuit 160 may compare a phase of the first training signal P_PULSE with that of the second training signal D_PULSE to generate the phase detection signal PD_DET.

More specifically, the training circuit 160 may include a pulse generation block 162, a reference delay block 164, and a phase detection block 166.

The pulse generation block 162 may generate the test pulse T_PULSE that pulses (or activates) for the set period in response to a training mode signal TM. The training mode signal TM may be supplied from the controller 20 shown in FIG. 1, in the form of the control signal CTRL. In another embodiment of the present invention, the training mode signal TM may be generated by decoding the command/address signal C/A supplied from the controller 20 shown in FIG. 1.

The reference delay block 164 may delay the test pulse T_PULSE by the reference delay value to output the second training signal D_PULSE. The reference delay value may be set to correspond to a setup/hold time of the alignment block 144.

The phase detection block 166 may compare a phase of the first training signal P_PULSE with that of the second training signal D_PULSE to generate the phase detection signal PD_DET. The phase detection block 166 may output the phase detection signal PD_DET at a logic high level when the phase of the first training signal P_PULSE leads the phase of the second training signal D_PULSE.

In other words, the training circuit 160 may generate the phase detection signal PD_DET by comparing the phase of the first training signal P_PULSE which is delayed by a delay value of the first clock path P1 from a moment when the test pulse T_PULSE is applied, to the phase of the second training signal D_PULSE delayed by the reference delay value.

The internal circuit 180 may process the first and second internal data DIN_R and DIN_F according to the command/address signal C/A, the control signal CTRL and the first to eighth sampling clocks GCLK1 to GCLK8. When the semiconductor device 100 is a memory device, the internal circuit 180 may include a memory cell region (not illustrated) and a peripheral region (not illustrated) including a sense amplifier/write driver. The internal circuit 180 may write the first and second internal data DIN_R and DIN_F or read out data stored in the memory cell region to the controller 20 of FIG. 1, according to the command/address signal C/A, the control signal CTRL and the first to eighth sampling clocks GCLK1 to GCLK8.

Figure 6:
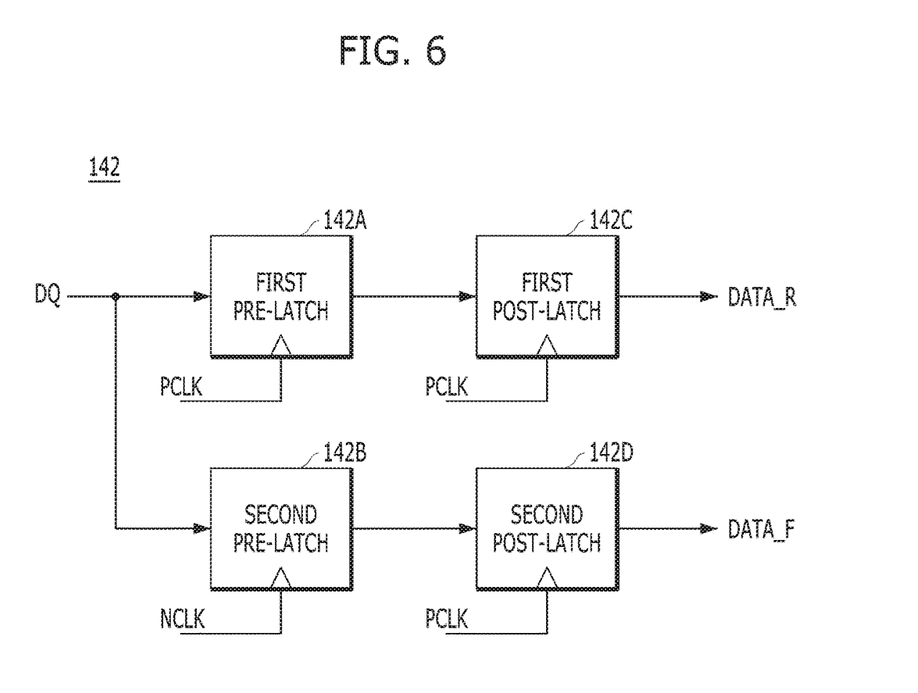
FIG. 6 is a detailed diagram of a parallelization block shown in FIG. 4.

FIG. 6 is a detailed block diagram illustrating the parallelization block 142 shown in FIG. 4.

Referring to FIG. 6, the parallelization block 142 may include first and second pre-latches 142A and 142B and first and second post-latches 142C and 142D.

The first pre-latch 142A may latch the data DQ in response to the first input clock PCLK. The second pre-latch 142B may latch the data DQ in response to the second input clock NCLK. The first post-latch 142C may latch the output of the first pre-latch 142A in response to the first input clock PCLK to output the first parallel data DATA_R. The second post-latch 142D may latch the output of the second pre-latch 142B in response to the first input clock PCLK to output the second parallel data DATA_F.

The parallelization block 142 having the aforementioned structure may latch the data DQ at a rising edge of the first input clock PCLK, latch the data DQ at a rising edge of the second input clock NCLK, and output the latched data as the first and second parallel data DATA_R and DATA_F, respectively, at a next rising edge of the first input clock PCLK.

Figure 7:
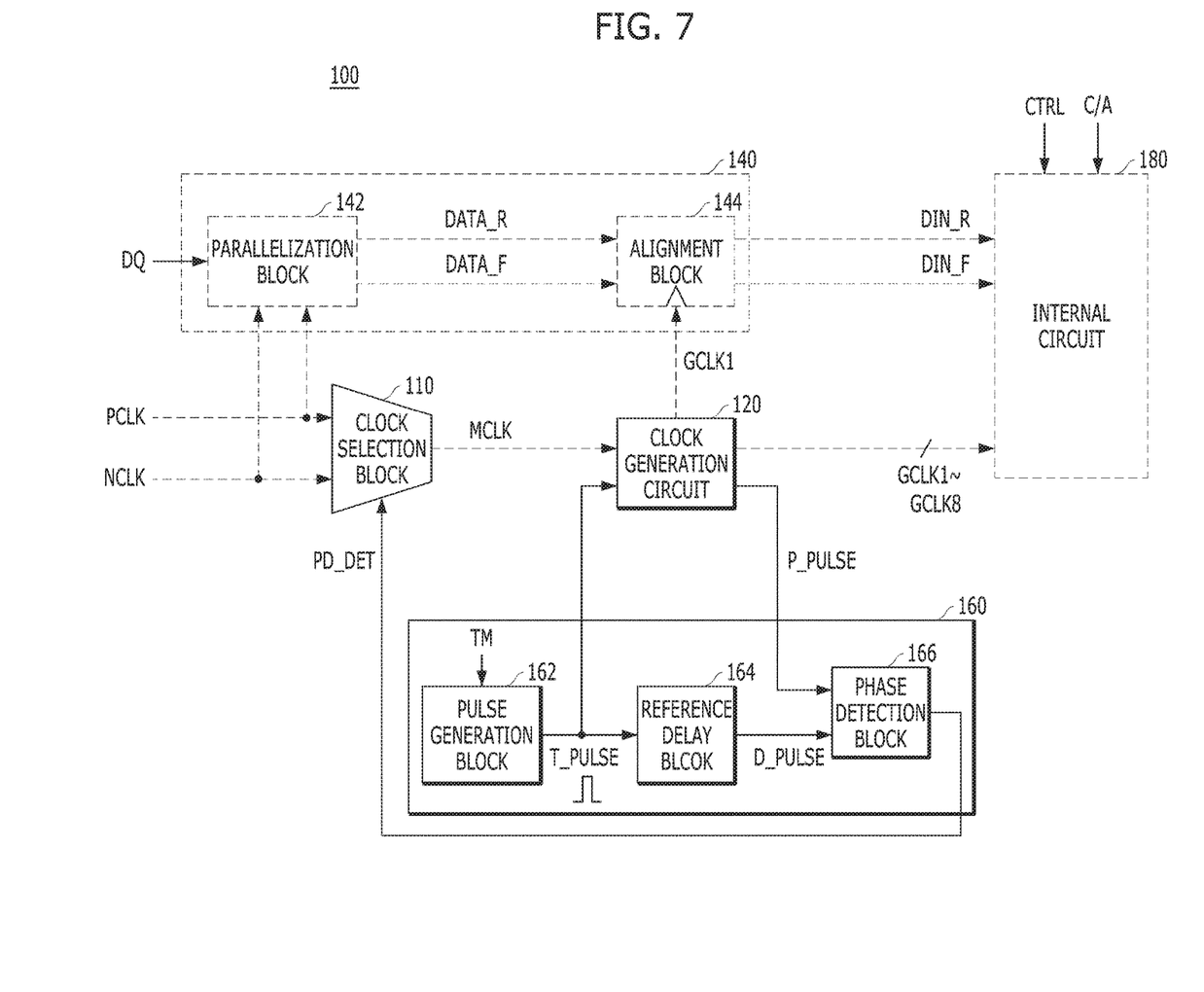
FIG. 7 is a block diagram for describing a training operation of a semiconductor device shown in FIG. 4.
Figure 8:
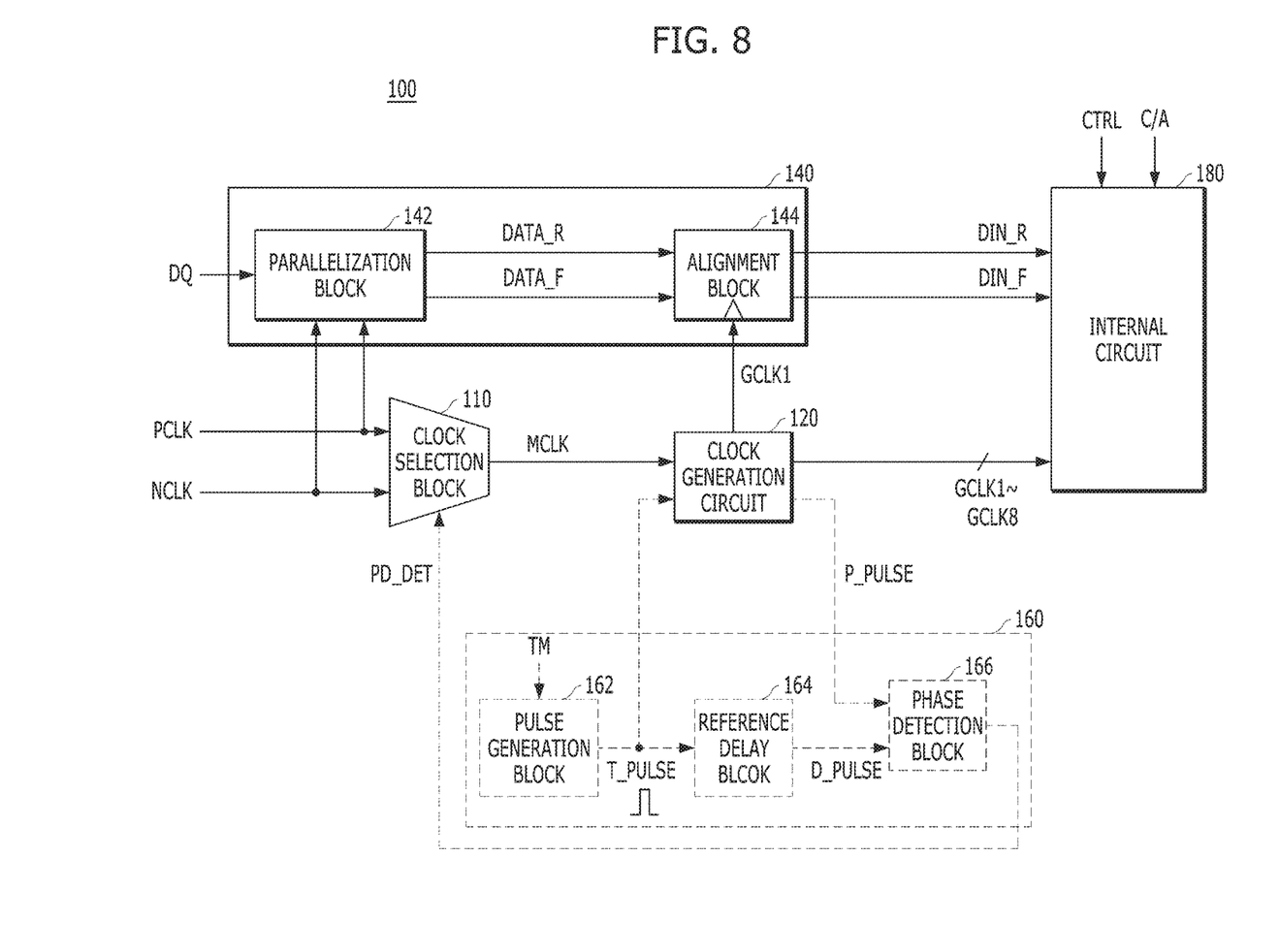
FIG. 8 is a block diagram for describing a normal operation of a semiconductor device shown in FIG. 4.

FIG. 7 is a block diagram for describing a training operation of the semiconductor device 100 shown in FIG. 4. FIG. 8 is a block diagram for describing a normal operation of the semiconductor device 100 shown in FIG. 4. In the following descriptions, the normal operation of the semiconductor device 100 may indicate operations excluding the training operation. For example, when the semiconductor device 100 is a memory device, the normal operation may indicate a write operation or a read operation.

Referring to FIG. 7, when the training mode signal TM is activated during the training operation, the pulse generation block 162 generates the test pulse T_PULSE that pulses (or activates) for a set period. The clock generation circuit 120 receives the test pulse T_PULSE and outputs the first training signal P_PULSE through the first clock path P1. The reference delay block 164 delays the test pulse T_PULSE by the reference delay value corresponding to the setup/hold time to output the second training signal D_PULSE. The phase detection block 166 may generate the phase detection signal PD_DET by compare the phase of the first training signal P_PULSE with that of the second training signal D_PULSE.

In other words, the training circuit 160 may generate the phase detection signal PD_DET by comparing the phase of the first training signal P_PULSE, which is delayed by the delay value of the first clock path P1 from a moment when the test pulse T_PULSE is applied (or activated), to the phase of the second training signal D_PULSE delayed by the reference delay value. When the phase of the first training signal P_PULSE leads the phase of the second training signal D_PULSE, the phase detection signal PD_DET may be outputted at a logic high level.

The clock selection block 110 may select the second input clock NCLK as the reference clock MCLK when the phase detection signal PD_DET is activated at a logic high level, and select the first input clock PCLK as the reference clock MCLK when the phase detection signal PD_DET is deactivated at a logic low level.

As described above, through the training operation, one of the first input clock PCLK and the second input clock NCLK is selected as the reference clock MCLK.

Referring to FIG. 8, during the normal operation, for example, a write operation, the training mode signal TM is deactivated, and the training circuit 160 does not operate.

The clock selection block 110 selects one of the first input clock PCLK and the second input clock NCLK based on the phase detection signal PD_DET set through the training operation, and outputs the selected clock as the reference clock MCLK. The clock generation circuit 120 distributes the reference clock MCLK to the first to eighth clock paths P1 to P8 to output the first to eighth sampling clocks GCLK1 to GCLK8. The parallelization block 142 parallelizes the data DQ based on the first input clock PCLK to output the first and second parallel data DATA_R and DATA_F. The alignment block 144 may align the first and second parallel data DATA_R and DATA_F based on the first sampling clock GCLK1 to output the first and second internal data DIN_R and DIN_F.

Hereinafter, an operation of outputting the first and second internal data DIN_R and DIN_F in response to the reference clock MCLK selected between the first input clock PCLK and the second input clock NCLK based on the clock tree delay value will be described with reference to the drawings.

Figure 9:
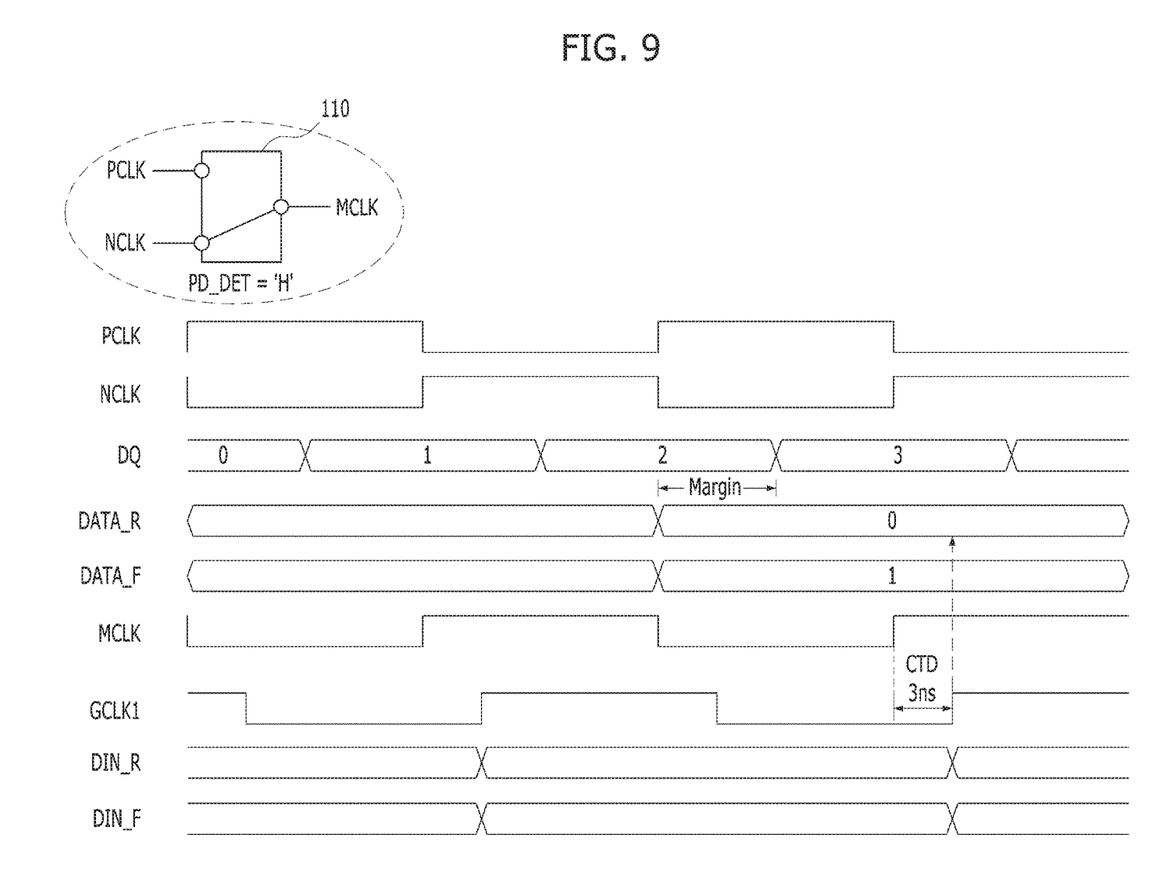
FIGS. 9 and 10 are timing diagrams for describing an operation of a semiconductor device depending on a clock tree delay amount in accordance with an embodiment of the present invention.
Figure 10:
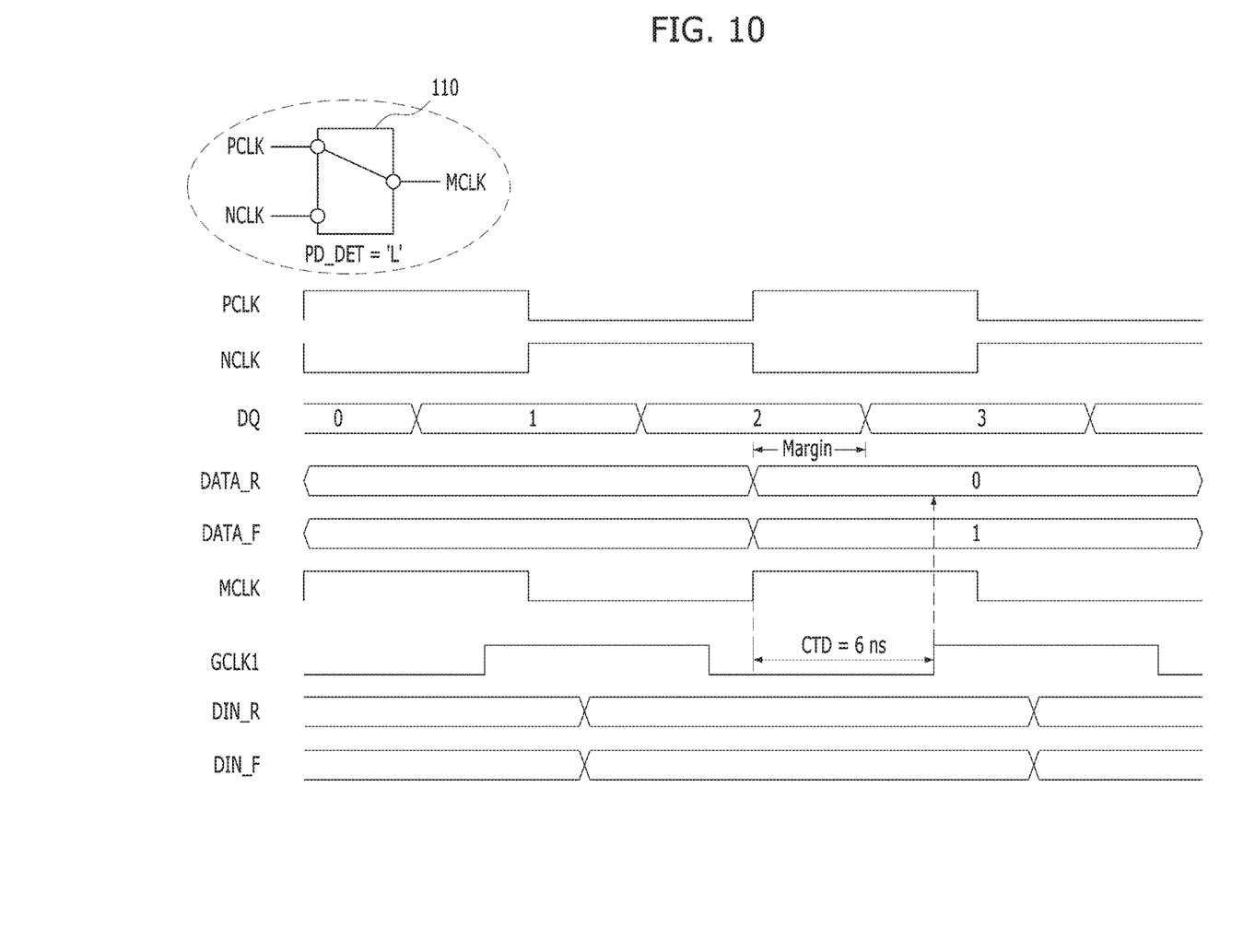

FIGS. 9 and 10 are timing diagrams for describing an operation of the semiconductor device 100 depending on the clock tree delay value in accordance with an embodiment of the present invention.

When the reference delay value is set to 4 ns, FIG. 9 shows that the clock tree delay value CTD is 3 ns less than the reference delay value, and FIG. 10 shows that the clock tree delay value CTD is 6 ns greater than the reference delay value.

Referring to FIG. 9, when the clock tree delay value CTD is less than the reference delay value, the phase of the first training signal P_PULSE leads the phase of the second training signal D_PULSE. Therefore, the training circuit 160 activates the phase detection signal PD_DET at a logic high level through the training operation.

During the normal operation, the clock selection block 110 selects the second input clock NCLK as the reference clock MCLK since the phase detection signal PD_DET is activated at a logic high level. The clock generation circuit 120 distributes the reference clock MCLK to the first to eighth clock paths P1 to P8 and outputs the first to eighth sampling clocks GCLK1 to GCLK8.

The parallelization block 142 latches the data DQ at the rising edge of the first input clock PCLK, and latches the data DQ at the rising edge of the second input clock NCLK. The parallelization block 142 outputs the latched data as the first and second parallel data DATA_R and DATA_F, respectively, at the next rising edge of the first input clock PCLK.

The alignment block 144 latches the first and second parallel data DATA_R and DATA_F based on the first sampling clock GCLK1 and outputs the latched data as the first and second internal data DIN_R and DIN_F. Since the second input clock NCLK is used for the reference clock MCLK, the setup/hold time may be secured with a larger margin when compared with the setup/hold time shown in FIG. 3. Accordingly, the alignment block 144 may normally operate.

Referring to FIG. 10, when the clock tree delay value CTD is larger than the reference delay value, the phase of the second training signal D_PULSE leads the phase of the first training signal P_PULSE. Therefore, the training circuit 160 outputs the phase detection signal PD_DET at a logic low level during the training operation.

During the normal operation, the clock selection block 110 selects the first input clock PCLK as the reference clock MCLK when the phase detection signal PD_DET is deactivated at a logic low level. The clock generation circuit 120 distributes the reference clock MCLK to the first to eighth clock paths P1 to P8 and outputs the first to eighth sampling clocks GCLK1 to GCLK8.

The parallelization block 142 may parallelize the data DQ based on the first input clock PCLK and the second input clock NCLK to output the first and second parallel data DATA_R and DATA_F. The alignment block 144 latches the first and second parallel data DATA_R and DATA_F based on the first sampling clock GCLK1 and outputs the latched data as the first and second internal data DIN_R and DIN_F. Since the first input clock PCLK is used for the reference clock MCLK, the setup/hold time may be secured with a sufficient margin. Accordingly, the alignment block 144 may normally operate.

As is apparent from the above descriptions, the semiconductor device in accordance with the embodiment selects a clock used for sampling data depending on a clock tree delay value during a training operation, and samples data based on the selected clock during a write operation. Therefore, the semiconductor device may secure a sufficient margin of the setup/hold time at the time of data sampling.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

What is claimed is:

1. A semiconductor device comprising:
   a clock selection block suitable for selecting a first input clock or a second input clock as a reference clock based on a phase detection signal;
   a clock generation circuit suitable for outputting first to $N^{th}$ sampling clocks by distributing the reference clock to first to $N^{th}$ clock paths, and outputting a first training signal by delaying a test pulse through one clock path among the first to $N^{th}$ clock paths during a training operation;
   a data input circuit suitable for sampling input data based on the first and second input clocks and one sampling clock outputted through the same clock path as the first training signal among the first to $N^{th}$ sampling clocks; and
   a training circuit suitable for delaying the test pulse by a reference delay value to output a second training signal, and comparing a phase of the first training signal with a phase of the second training signal to generate the phase detection signal, during the training operation.

2. The semiconductor device of claim 1, wherein the second input clock has a phase opposite to a phase of the first input clock.

3. The semiconductor device of claim 1, wherein the training circuit comprises:
   a pulse generation block suitable for generating the test pulse that activates for a set period, based on a training mode signal;
   a reference delay block suitable for delaying the test pulse by the reference delay value to output the second training signal; and
   a phase detection block suitable for generating the phase detection signal by comparing the phase of the first training signal with that of the second training signal.

4. The semiconductor device of claim 1, wherein the data input circuit comprises:
   a parallelization block suitable for parallelizing the input data based on the first input clock and the second input clock to output first and second parallel data; and
   an alignment block suitable for aligning the first and second parallel data based on the one sampling clock.

5. The semiconductor device of claim 4, wherein the reference delay value is set to correspond to a setup/hold time of the alignment block.

6. The semiconductor device of claim 1, wherein the clock generation circuit has a clock tree structure that forms the first to $N^{th}$ clock paths using a plurality of clock buffers coupled in series.

7. The semiconductor device of claim 1, further comprising an internal circuit suitable for processing the data aligned in the data input circuit based on the first to $N^{th}$ sampling clocks.

8. The semiconductor device of claim 1, wherein the one clock path is the first clock path, and the one sampling clock is the first sampling clock.

9. A semiconductor system comprising:
   a semiconductor device; and
   a controller suitable for providing first and second input clocks to the semiconductor device, and transmitting and receiving data,
   wherein the semiconductor device comprises:
      a clock selection block suitable for selecting the first input clock or the second input clock as a reference clock based on a phase detection signal;
      a clock generation circuit suitable for outputting first to $N^{th}$ sampling clocks by distributing the reference clock to first to $N^{th}$ clock paths, and outputting a first training signal by delaying a test pulse through one clock path among the first to $N^{th}$ clock paths during a training operation;
      a data input circuit suitable for sampling the data transmitted from the controller based on the first and second input clocks and one sampling clock outputted through the same clock path as the first training signal among the first to $N^{th}$ sampling clocks; and
      a training circuit suitable for delaying the test pulse by a reference delay value to output a second training operation, and comparing a phase of the first training signal with a phase of the second training signal to generate the phase detection signal, during the training operation.

10. The semiconductor system of claim 9, wherein the second input clock has a phase opposite to a phase of the first input clock.

11. The semiconductor system of claim 9, wherein the training circuit comprises:
    a pulse generation block suitable for generating the test pulse that activates for a set period, based on a training mode signal;
    a reference delay block suitable for delaying the test pulse by the reference delay value to output the second training signal; and
    a phase detection block suitable for generating the phase detection signal by comparing the phase of the first training signal with that of the second training signal.

12. The semiconductor system of claim 9, wherein the data input circuit comprises:

a parallelization block suitable for parallelizing the data based on the first input clock and the second input clock to output first and second parallel data; and an alignment block suitable for aligning the first and second parallel data based on the one sampling clock.

13. The semiconductor system of claim 12, wherein the reference delay value is set to correspond to a setup/hold time of the alignment block.

14. The semiconductor system of claim 9, wherein the clock generation circuit has a clock tree structure that forms the first to $N^{th}$ clock paths using a plurality of clock buffers coupled in series.

15. The semiconductor system of claim 9, further comprising an internal circuit suitable for processing the data aligned in the data input circuit based on the first to $N^{th}$ sampling clocks.

16. The semiconductor system of claim 9, wherein the one clock path is the first clock path, and the one sampling clock is the first sampling clock.

17. An operating method of a semiconductor device, the operating method comprising:

generating a first training signal by applying a test pulse to one clock path among a plurality of clock paths forming a clock tree structure, and generating a second training signal by delaying the test pulse by a reference delay value, during a training operation;

comparing a phase of the first training signal with a phase of the second training signal to generate a phase detection signal;

selecting a first input clock or a second input clock as a reference clock based on the phase detection signal, during a normal operation; and aligning input data based on a first sampling clock generated by applying the reference clock to the one clock path.

18. The operating method of claim 17, wherein the second input clock has a phase opposite to a phase of the first input clock.

19. The operating method of claim 17, wherein the aligning of the input data based on the first sampling clock comprises:

parallelizing the input data based on the first input clock and the second input clock and outputting first and second parallel data; and aligning the first and second parallel data based on the first sampling clock.

20. The operating method of claim 17, wherein the reference delay value is set to correspond to a setup/hold time when the input data are aligned.

* * * * *